United States Patent
Sugawara

(10) Patent No.: US 7,548,479 B2
(45) Date of Patent: Jun. 16, 2009

(54) SEMICONDUCTOR MEMORY DEVICE AND MANUFACTURING METHOD THEREOF

(75) Inventor: Hiroshi Sugawara, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 102 days.

(21) Appl. No.: 11/822,991

(22) Filed: Jul. 11, 2007

(65) Prior Publication Data

US 2008/0049538 A1 Feb. 28, 2008

(30) Foreign Application Priority Data

Jul. 13, 2006 (JP) ............................. 2006-193112

(51) Int. Cl.
*G11C 17/18* (2006.01)
(52) U.S. Cl. .................. 365/225.7; 365/96; 365/230.01
(58) Field of Classification Search .............. 365/225.7, 365/96, 230.01, 189.03, 230.04, 230.06, 365/230.08

See application file for complete search history.

(56) References Cited

U.S. PATENT DOCUMENTS 6,202,180 B1 * 3/2001 Nose .......................... 714/718
2008/0002511 A1 * 1/2008 Mou et al. ............. 365/230.06

FOREIGN PATENT DOCUMENTS

JP 2004-265162 9/2004

* cited by examiner

*Primary Examiner*—Dang T Nguyen
(74) *Attorney, Agent, or Firm*—McGinn IP Law Group, PLLC

(57) ABSTRACT

A semiconductor memory device includes: a memory array; an internal address supplying unit configured to produce a first internal address in response to an external address; a first fuse unit configured to includes fuses and anti-fuses integrated; an address switching circuit configured to produce a second internal address on the basis of the first internal address; and a decoder circuit configured to select a memory cell of the memory array in response to the second internal address. The internal address supplying unit is configured to be capable of fixing a specific address bit in the first internal address. The second internal address includes: fuse independent address bits produced from address bits which is not the specific address bit in the first internal address, independently of a state of the first fuse unit, and a fuse dependent address bit having a value corresponding to the state of the first fuse unit and a vale of the specific address bit.

8 Claims, 5 Drawing Sheets

SEMICONDUCTOR MEMORY DEVICE AND MANUFACTURING METHOD THEREOF

BACKGROUND OF THE INVENTION

1. Field of the Invention

The present invention relates to a semiconductor memory device and, more particularly, to a technique for designing a semiconductor memory device of a small capacity (e.g., 4 Mbit) by slightly changing a design of a semiconductor memory device of a large capacity (e.g., 8 Mbit).

2. Description of Related Art

Users individually have various demands for a capacity of a semiconductor memory device such as a flash memory. In response to the users' demands, manufacturers of semiconductor memories are required to offer a lineup of semiconductor memories of various capacities as products.

However, it is not preferable from the viewpoint of a manufacturing cost to individually offer the lineup of the semiconductor memory device products of the various capacities as individual products. Individual designs and manufacturing processes of the semiconductor memory device products of the various capacities increase time and effort in designing and manufacturing the semiconductor memory device products, so as to raise the production cost.

One of approaches to solve the above-described problems is to fix a part of address bits (typically, a higher-order address bit) in a semiconductor memory device of a large capacity by changing the design of a wiring layer, thereby providing a semiconductor memory device of a pseudo-small capacity. For example, if the highest-order address of a semiconductor memory device of a capacity of 8 Mbit is fixed inside, the semiconductor memory device functions as a semiconductor memory device of a capacity of 4 Mbit. In the same manner, if two higher-order address bits are fixed inside, the semiconductor memory device functions as a semiconductor memory device of a capacity of 2 Mbit. The above-described technique is often called "cutting-down". Manufacturing of a semiconductor memory device of a small capacity by the cutting-down is effective in reducing the production cost since most of designing and manufacturing processes can be commonly used for both of the semiconductor memory device of the large capacity and the semiconductor memory device of the small capacity.

The cutting-down is particularly effective in a case where miniaturization of processes sufficiently proceeds with respect to a size of a semiconductor memory device. As the miniaturization of the processes proceeds, a ratio of the size of a peripheral circuit (other than a memory array) to the chip size of the entire semiconductor memory device relatively becomes higher. In the case of the higher ratio of the size of the peripheral circuit, a difference between a chip size of a product of a small capacity and a chip size of a product of a large capacity is small. In this case, the common processes for designing and manufacturing the semiconductor memory device bring about more significant advantages than an increase in chip size per capacity by the cutting-down.

However, I have now discovered that the manufacturing of the semiconductor memory device of the small capacity by the cutting-down raises an unnecessary decrease in yield. For example, assume that the semiconductor memory device of the capacity of 8 Mbit is made to function as the semiconductor memory device of the capacity of 4 Mbit. Even if a deficiency, which cannot be remedied, is found in an inspection process of the memory cell of 4 Mbit which is one part of the semiconductor memory device of 8 Mbit and will be actually used, no deficiency may be found in the memory cell of 4 Mbit which is another part of the semiconductor memory device of 8 Mbit and won't be actually used. However, when the technique for fixing the higher-order address bit by changing the design of the wiring layer is used, the memory cell of 4 Mbit which possibly has no deficiency cannot be used.

Japanese Laid-Open Patent Application JP-A2004-265162 (corresponding to U.S. Pat. No. 7,197,595B2) discloses a technique for avoiding a block including a deficient bit, selecting a block to be used, and assigning an address to the selected block. However, the technique disclosed in JP-A2004-265162 cannot cope with a semiconductor memory device which functions as a semiconductor memory device having a pseudo-small capacity by fixing a part of address bits according to a design change.

SUMMARY

The present invention seeks to solve one or more of the above problems, or to improve upon those problems at least in part. In one embodiment, a semiconductor memory device includes: a memory array; an internal address supplying unit configured to produce a first internal address in response to an external address; a first fuse unit configured to includes fuses and anti-fuses integrated; an address switching circuit configured to produce a second internal address on the basis of the first internal address; and a decoder circuit configured to select a memory cell of the memory array in response to the second internal address. The internal address supplying unit is configured to be capable of fixing a specific address bit in the first internal address. The second internal address includes: fuse independent address bits produced from address bits which is not the specific address bit in the first internal address, independently of a state of the first fuse unit, and a fuse dependent address bit having a value corresponding to the state of the first fuse unit and a value of the specific address bit.

In the present invention, this semiconductor memory device as configured above functions as a semiconductor memory device having a pseudo-small capacity by fixing the specific address bit thereby fixing a part of address bits according to a design change, although the semiconductor memory device inherently has a large capacity. In addition, in a case where a memory cell of a memory array to be used by a user is initially deficient, this semiconduct or memory device can switch the fuse dependent address bit by setting the fuse (or anti-fuse) in the first fuse unit such that a memory array which does not have a deficient memory cell is accessed. Therefore, it is possible to enhance the yield of the semiconductor memory device.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
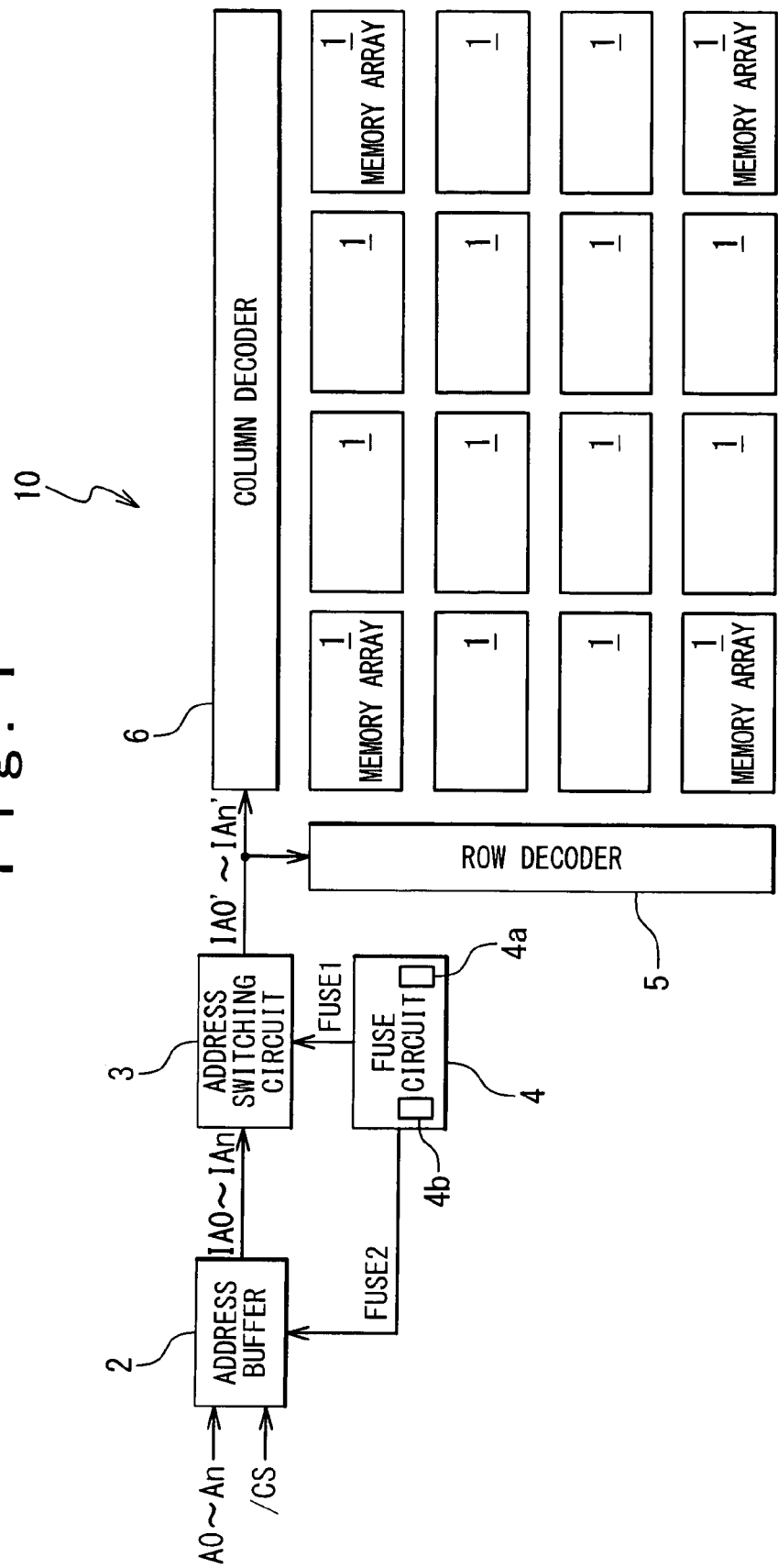
FIG. 1 is a block diagram illustrating a configuration of a semiconductor memory device in an embodiment according to the present invention.

FIG. 1 is a block diagram illustrating a configuration of a semiconductor memory device 10 in an embodiment according to the present invention. The semiconductor memory device 10 in the present embodiment is a so-called flash memory, having a configuration capable of coping with cutting-down. Only a half of an inherent capacity is used in the semiconductor memory device 10, which thus functions as a semiconductor memory device of a small capacity.

The semiconductor memory device 10 includes memory arrays 1 arranged in a matrix, an address buffer 2, an address switching circuit 3, a fuse circuit 4, a row decoder 5, and a column decoder 6. The fuse circuit 4 includes a first fuse circuit 4a and a second fuse circuit 4b. Although the memory arrays 1 are arranged in the matrix with 4 rows and 4 columns in the present embodiment, the present invention is not limited to this example, and the memory arrays 1 may be arranged in various matrices.

In each of the memory arrays 1, memory cells, each of which accumulates electric charges in a floating gate so as to store data therein, are arranged in the matrix. Here, it is noted that the technical term of the floating gate should not be limited to the meaning of a conductor such as polysilicon but should includes the meaning of an insulator capable of holding the electric charges, like it is adopted in an MONOS (abbreviating "metal oxide nitride oxide silicon") technique.

The address buffer 2 has a function of receiving external addresses A0 to An, and then, of producing internal addresses IA0 to IAn. A chip select signal /CS is supplied to the address buffer 2. The external addresses A0 to An are permitted to be inputted only in a case where the chip select signal /CS is activated (i.e., only in the case where the chip select signal /CS is pulled down to a "Low" level).

The address buffer 2 is configured in such a manner as to fix an internal address bit IAk of the internal addresses IA0 to IAn in response to a fuse signal FUSE2 to be supplied from the fuse circuit 4 (second fuse circuit 4b). Specifically, when the fuse signal FUSE2 is fixed to a "High" level, the address buffer 2 fixes the internal address bit IAk to data "1". In contrast, when the fuse signal FUSE2 is fixed to a "Low" level, the internal address bit IAk is not fixed but produced such that the internal address bit IAk corresponds to an external address bit Ak.

As described later, the fuse signal FUSE2 is a signal for determining an effective memory capacity of the semiconductor memory device 10. When a predetermined fuse in the fuse circuit 4 is cut off, the fuse signal FUSE2 is fixed to the "High" level, and therefore, the internal address bit IAk is fixed to a given value (the data "1" in the present embodiment). As a consequence, a half of the memory arrays 1 cannot be accessed from the outside. A user of the semiconductor memory device 10 can use only a half of a capacity inherent in the memory arrays 1. The user need not supply the external address bit Ak of the external addresses A0 to An. Even if the user supplies the external address bit Ak, the internal address bit IAk is not determined in accordance with the supplied external address bit Ak.

Figure 2:
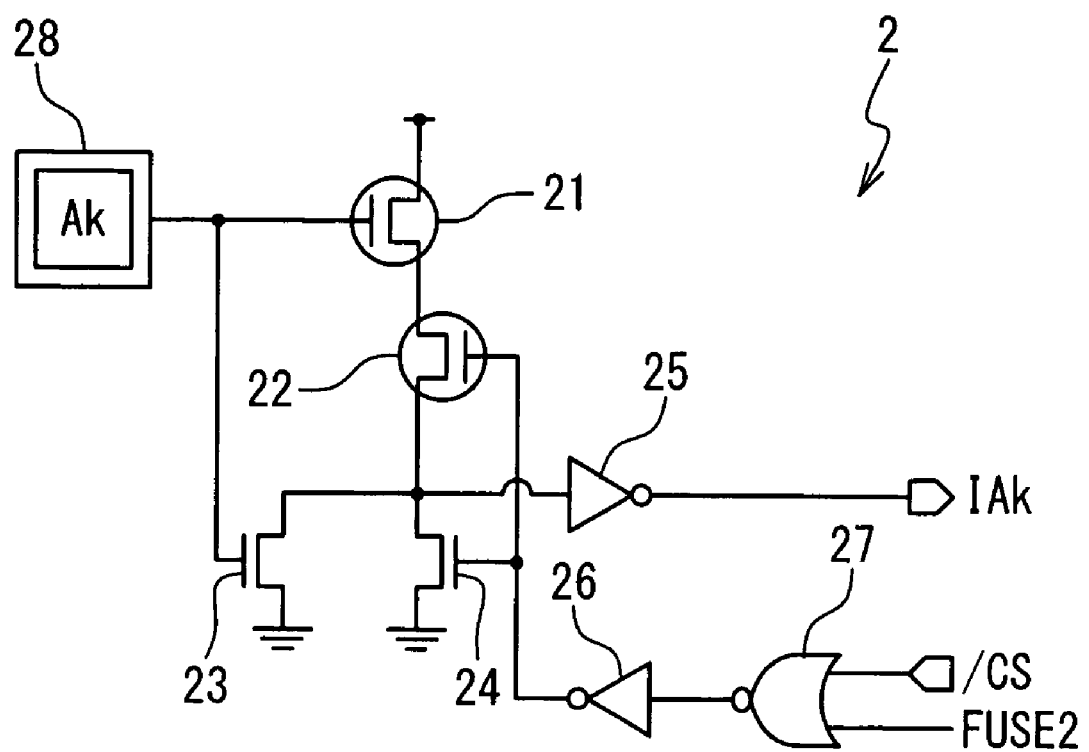
FIG. 2 is a circuit diagram exemplifying a configuration of an address buffer in the present embodiment.

FIG. 2 is a circuit diagram exemplifying a configuration of a portion relevant to the external address bit Ak and the internal address bit IAk in the address buffer 2, wherein other portions are configured in the same manner as those in a general address buffer. The address buffer 2 in the present embodiment includes PMOS transistors 21 and 22, NMOS transistors 23 and 24, inverters 25 and 26, and an NOR gate 27.

The PMOS transistors 21 and 22 and the NMOS transistors 23 and 24 function as a 2-input NOR gate. One input of the 2-input NOR gate is connected to a pad 28 for receiving the external address bit Ak, and the other input is connected to an output of the inverter 26. An input of the inverter 26 is connected to an output of the NOR gate 27. To a first input of the NOR gate 27, the chip select signal ICS is supplied. In the meantime, to a second input of the NOR gate 27, the fuse signal FUSE2 is supplied. An output terminal NOUT of the 2-input NOR gate constituted of the PMOS transistors 21 and 22 and the NMOS transistors 23 and 24 is connected to an input of the inverter 25. The internal address bit IAk is outputted through an output of the inverter 25.

The address buffer 2 such configured as described above fixes the internal address bit IAk to the given value (the data "1" in the present embodiment) when the fuse signal FUSE2 is fixed to the "High" level. In contrast, the address buffer 2 functions in the same manner as a normal address buffer when the fuse signal FUSE2 is fixed to the "Low" level. In other words, the internal address bit IAk is produced such that the internal address bit IAk corresponds to the external address bit Ak in the case where the chip select signal /CS is activated (i.e., in the case where the chip select signal /CS is in the "Low" level). In contrast, the internal address bit IAk is fixed to the data "1" in the case where the chip select signal /CS is not activated.

The address switching circuit 3 produces internal addresses IA0' to IAn' for actual use in selecting the memory cell based on the internal addresses IA0 to IAn supplied from the address buffer 2. The internal addresses IA0' to IAn' basically have the same values as those of the internal addresses IA0 to IAn, respectively. Here, an internal address bit IAk' may be produced in such a manner as to become a value reversal (i.e., a value complementary) to the internal address bit IAk according to a state of a fuse signal FUSE1 to be supplied from the fuse circuit 4 (first fuse circuit 4a). Another internal address IAj' (where j≠k) is produced in such a manner as to have the same value as that of an internal address IAj to be supplied from the address buffer 2 irrespective of a value of the fuse signal FUSE1.

Figure 3:
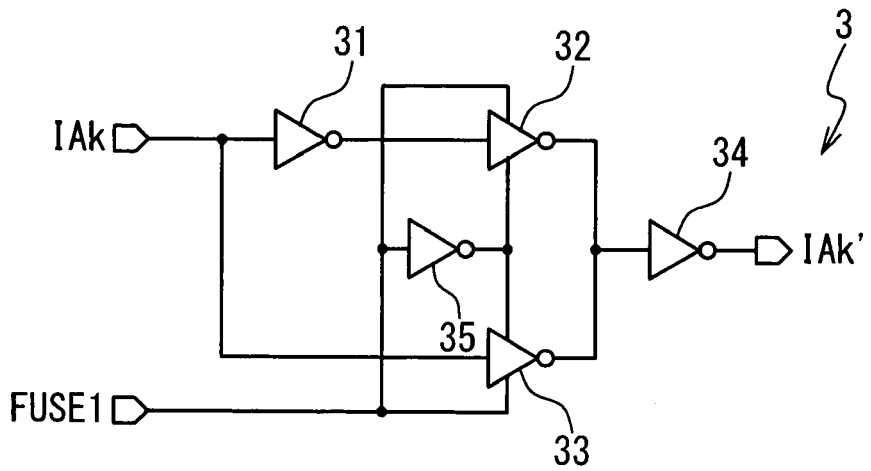
FIG. 3 is a circuit diagram exemplifying a configuration of an address switching circuit in the present embodiment.

FIG. 3 is a circuit diagram exemplifying a configuration of a portion relevant to the internal address bits IAk and IAk' in the address switching circuit 3. The address switching circuit 3 includes inverters 31 to 35. The inverters 31 and 32 are connected in series to each other, and further, the internal address bit IAk is commonly supplied to both inputs of the inverters 31 and 33. Outputs of the inverters 32 and 33 are commonly connected to an input of the inverter 34. The internal address bit IAk' is outputted from an output of the inverter 34. To a power source terminal of the inverter 32 and a ground terminal of the inverter 33, the fuse signal FUSE1 is directly inputted. In contrast, to a ground terminal of the inverter 32 and a power source terminal of the inverter 33, the fuse signal FUSE1 is inputted through the inverter 35.

The address switching circuit 3 such configured as described above sets the internal address bit IAk' to a value reversal to that of the internal address bit IAk when the fuse signal FUSE1 is in the "High" level. In contrast, the address switching circuit 3 sets the internal address bit IAk' to a same value as that of the internal address bit IAk when the fuse signal FUSE1 is in the "Low" level.

It is noted that the internal address bit IAk' such produced as described above has a value fixed in accordance with a state of the fuse signal FUSE1. As described above, since a value of the internal address bit IAk is fixed by the address buffer 2, the value of the internal address bit IAk' also is fixed (in accordance with the state of the fuse signal FUSE1).

Figure 4:
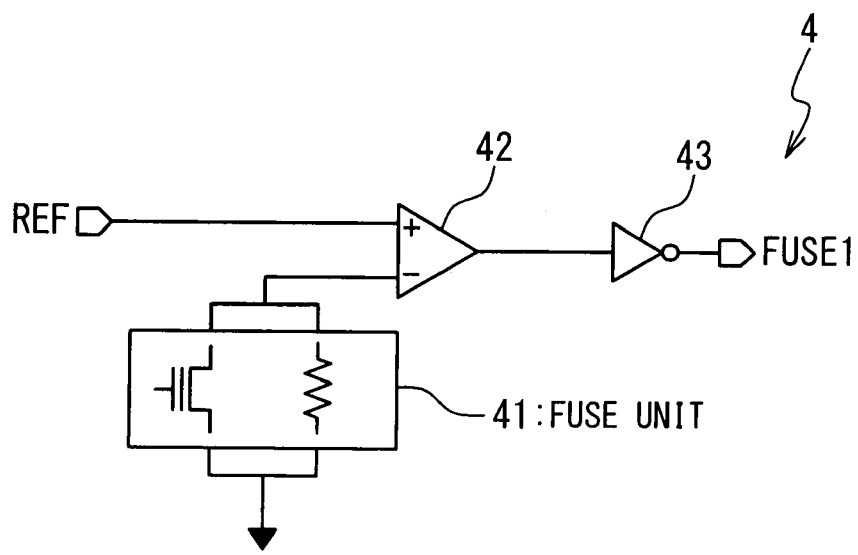
FIG. 4 is a circuit diagram exemplifying a configuration of a fuse circuit in the present embodiment.

The fuse circuit 4 produces the fuse signals FUSE1 and FUSE2 in accordance with the state of the fuses integrated inside thereof. FIG. 4 is a circuit diagram exemplifying the configuration of a portion for producing the fuse signal FUSE1 in the fuse circuit 4.

The fuse circuit 4 includes a fuse unit 41, a comparator 42, and an inverter 43. The fuse unit 41 includes the fuses integrated inside thereof, and produces an output signal in accordance with the state of the fuse. Specifically, the output in the fuse unit 41 is in the "High" level in a state in which the fuse is not blown out. In contrast, the output in the fuse unit 41 is pulled down to the "Low" level when the fuse is blown out. The fuses integrated in the fuse unit 41 may be blown out by a laser beam or may be blown out by an electric power. Anti-fuses, which come into a conductive state with the application of a writing voltage, may be integrated in the fuse unit 41.

The comparator 42 receives a reference signal REF at an inverting input thereof while an output from the fuse unit 41 is connected to a non-inverting input thereof. An output of the comparator 42 is connected to an input of the inverter 43. The fuse signal FUSE1 is outputted from an output of the inverter 43. In the fuse circuit 4 such configured as described above, the fuse signal FUSE1 is pulled up to the "High" level when the fuse corresponding to the fuse signal FUSE1 is blown out. In contrast, the fuse signal FUSE1 is kept in the "Low" level when the fuse corresponding to the fuse signal FUSE1 is not blown out.

A portion for producing the fuse signal FUSE2 is configured in the same manner as that for producing the fuse signal FUSE1. The fuse signal FUSE2 is pulled up to the "High" level when a fuse corresponding to the fuse signal FUSE2 is blown out. In contrast, the fuse signal FUSE2 is kept in the "Low" level when the fuse corresponding to the fuse signal FUSE2 is not blown out.

Figure 6:
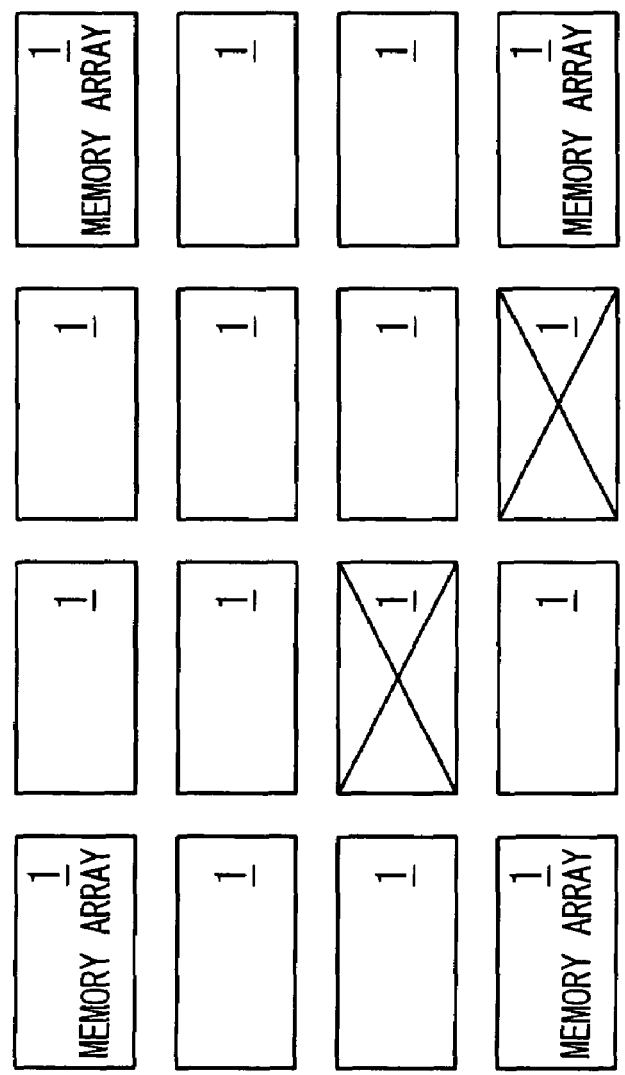
FIG. 6 is a diagram conceptually illustrating the relationship between internal address bits IAk' and IAi' and memory arrays in the present embodiment.

Returning to FIG. 1, the row decoder 5 and the column decoder 6 select the memory array 1 according to the internal address IA0' to IAn' received from the address switching circuit 3, and further, select the memory cell in the selected memory array 1. As illustrated in FIG. 6, the row decoder 5 is configured in such a manner as to use the internal address bits IAi' and IAk' in selecting the row of the memory arrays 1. In particular, the row decoder 5 specifies two of four rows of the memory arrays 1 in accordance with the internal address bit IAk', and then, specifies one of the two rows of the memory arrays 1 in accordance with the internal address bit IAi'.

It is noted that the internal address bit IAk' is a fixed value, which is determined in response to the fuse signal FUSE1 (i.e., in accordance with the state of the fuse in the fuse circuit 4). In other words, the effective memory array 1 is determined in response to the fuse signal FUSE1 (i.e., in accordance with the state of the fuse in the fuse circuit 4). If the fuse signal FUSE1 is in the "Low" level (i.e., if the corresponding fuse is not blown out), the internal address bit IAk' is fixed to the data "1", and thus, the row of the memory arrays 1 corresponding to the internal address bit IAk' fixed to the data "1" is selected all the time. In contrast, if the fuse signal FUSE1 is in the "High" level (i.e., if the corresponding fuse is blown out), the internal address bit IAk' is fixed to the data "0", and thus, the row of the memory arrays 1 corresponding to the internal address bit IAk' fixed to the data "0" is selected all the time.

In the semiconductor memory device 10 such configured as described above, the internal address bit IAk' is switched according to the blowing-out of the fuse, thereby enhancing a yield. If the memory cell at the memory array 1 corresponding to the internal address bit IAk' fixed to the data "1" is deficient, the fuse signal FUSE1 is set to the "High" level by blowing out the fuse. In this manner, the internal address bit IAk' can be switched from "1" to "0". As a consequence, if the memory cell at the memory array 1 corresponding to the internal address bit IAk' fixed to the data "0" is not deficient, this semiconductor memory device can be shipped as a product capable of performing a normal operation. Thus, it is possible to effectively enhance the yield of the semiconductor memory device 10.

Figure 5:
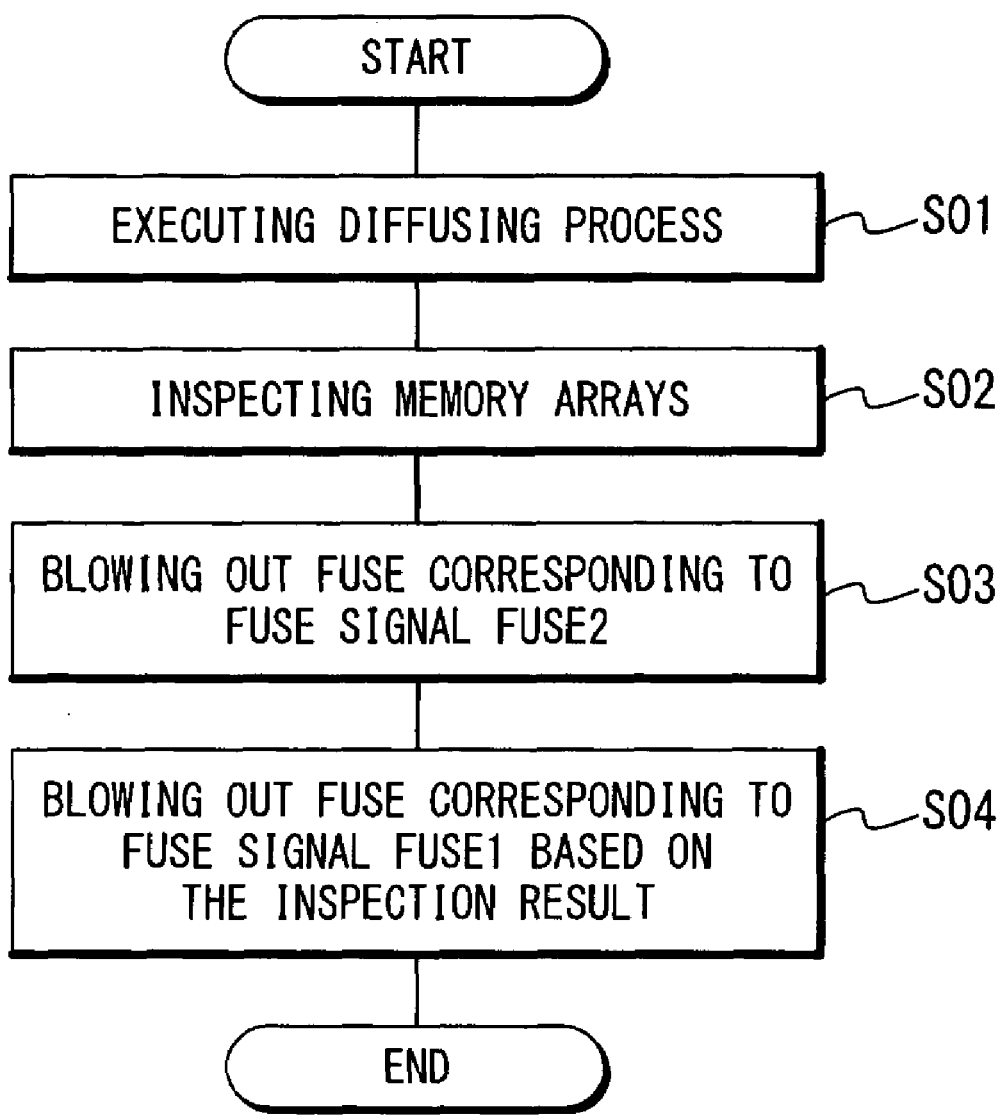
FIG. 5 is a flowchart illustrating processes for manufacturing the semiconductor memory device in the present embodiment.

The above-described semiconductor memory device 10 maybe manufactured in manufacturing processes illustrated in a flowchart of, for example, FIG. 5. Upon completion of a diffusing process (i.e., an integrating process) for the semiconductor memory device 10 (step S01), all of the memory cells of the memory arrays 1 are inspected (step S02). It is noted that in this step, since the fuse corresponding to the fuse signal FUSE2 is not blown out, the internal address bit IAk is produced in accordance with the external address Ak to be supplied from the outside, so as to access to all of the memory arrays 1. In addition, it is noted that since the fuse corresponding to the fuse signal FUSE1 is not blown out, the internal address bit IAk' corresponds with the internal address bit IAk.

Subsequently to the inspection of the memory cells, the fuse corresponding to the fuse signal FUSE2 is blown out, and therefore, the fuse signal FUSE2 is pulled up to the "High" level (step S03). Thus, the internal address bit IAk is fixed to the data "1".

Moreover, if the inspection in step S01 finds that the memory array 1 corresponding to the internal address bit IAk' fixed to the data "1" is deficient, the fuse corresponding to the fuse signal FUSE1 is blown out, the fuse signal FUSE1 is pulled up to the "High" level (step S04). Thus, the internal address bit IAk' is reversed from the data "1" to the data "0". Thereafter, the memory array 1 corresponding to the internal address bit IAk' fixed to the data "0" is used in storing the data.

In contrast, if it is not found that the memory array 1 corresponding to the internal address bit IAk' fixed to the data "1" is deficient, the fuse signal FUSE1 is kept in the "Low" level, and therefore, the memory array 1 corresponding to the internal address bit IAk' fixed to the data "1" is used in storing the data.

As described above, if the memory cell at the memory array 1 corresponding to the internal address bit IAk' fixed to the data "1" is deficient, the internal address bit IAk' is switched to "0", so that the memory array 1 corresponding to the internal address bit IAk' fixed to "0" can be used in the semiconductor memory device 10 in the present embodiment. Thus, it is possible to effectively enhance the yield of the semiconductor memory device 10.

As described above, this embodiment includes a manufacturing method of a semiconductor memory device. Here, the semiconductor memory device is configured to include: a memory array; an internal address supplying unit configured to produce a first internal address in response to an external address; a first fuse unit configured to includes fuses and anti-fuses integrated; a second fuse unit configured to includes fuses and anti-fuses integrated; an address switching circuit configured to produce a second internal address on the basis of the first internal address; and a decoder circuit configured to select a memory cell of the memory array in response to the second internal address. The internal address supplying unit is configured to be capable of fixing a specific address bit in the first internal address. The second internal address includes: fuse independent address bits produced from address bits which is not the specific address bit in the first internal address, independently of a state of the first fuse unit, and a fuse dependent address bit having a value corresponding to the state of the first fuse unit and a value of the specific address bit. The internal address supplying unit produces all address bits of the first internal address in response to corresponding respective address bits of the external address, when the second fuse unit is set to a first state, and the internal address supplying unit produces address bits except for the specific address bit of the first internal address in response to corresponding respective address bits of the external address, and fixes the specific address bit to a predetermined value, when the second fuse unit is set to a second state. The manufacturing method includes: (a) inspecting the memory array in a state where the second fuse unit is set to the first state; (b) fixing a specific address bit of the first internal address by setting the second fuse unit to the second state, after the step (a) and (c) setting the fuse dependent address bit to a desirable value by setting a state of the first fuse unit on the basis of a result of the inspection of the memory array.

Although the single internal address bit IAk' is fixed to a value in accordance with the state of the fuse integrated in the fuse circuit in the present embodiment, n address bits in the internal addresses IA0' to IAn' may be fixed to the value in accordance with the state of the fuse unit. Thus, the semiconductor memory device inherently having a capacity of M bits can function as a semiconductor memory device having a capacity of M/2n bits. In this case, the state of the fuses (or the anti-fuses) integrated in each of the fuse units is determined such that then fixed address bits correspond to the memory array 1 without any failure.

Although the description has been given in the present embodiment on the assumption that the semiconductor memory device 10 is the flash memory, it is obvious for one skilled in the art that the invention is applicable to other semiconductor memories such as a DRAM (abbreviating "a dynamic random access memory") and an SRAM (abbreviating "a static random access memory").

According to the present invention, it is possible to enhance the yield of the semiconductor memory device which functions as the semiconductor memory device having a pseudo-small capacity by fixing a part of the address bits according to the a design change, although the semiconductor memory device inherently has a large capacity.

It is apparent that the present invention is not limited to the above embodiment, but may be modified and changed without departing from the scope and spirit of the invention.

What is claimed is:

1. A semiconductor memory device comprising:
a memory array;
an internal address supplying unit configured to produce a first internal address in response to an external address;
a first fuse unit configured to includes fuses and anti-fuses integrated;
an address switching circuit configured to produce a second internal address on the basis of said first internal address; and
a decoder circuit configured to select a memory cell of said memory array in response to said second internal address,
wherein said internal address supplying unit is configured to be capable of fixing a specific address bit in said first internal address,
wherein said second internal address includes:
fuse independent address bits produced from address bits which is not said specific address bit in said first internal address, independently of a state of said first fuse unit, and
a fuse dependent address bit having a value corresponding to said state of said first fuse unit and a value of said specific address bit.

2. The semiconductor memory device according to claim 1, further comprising:
a second fuse unit configured to includes fuses and anti-fuses integrated,
wherein said internal address supplying unit produces all address bits of said first internal address in response to corresponding respective address bits of said external address, when said second fuse unit is set to a first state, and
said internal address supplying unit produces address bits except for said specific address bit of said first internal address in response to corresponding respective address bits of said external address, and fixes said specific address bit to a predetermined value, when said second fuse unit is set to a second state.

3. The semiconductor memory device according to claim 2, wherein said memory cell is a flash memory.

4. The semiconductor memory device according to claim 2, wherein said fuse dependent address bit has one of a value of said specific address bit and a reversed value of said specific address bit.

5. A semiconductor memory device comprising:
a plurality of memory arrays;
an internal address supplying unit configured to produce a first internal address in response to an external address;
a first fuse unit configured to includes fuses and anti-fuses integrated;
an address switching circuit configured to produce a second internal address on the basis of said first internal address; and
a decoder circuit configured to select one of said plurality of memory arrays and a memory cell of said one of the plurality of memory arrays in response to said second internal address,
wherein said internal address supplying unit is configured to be capable of fixing a specific address bit in said first internal address,
wherein said second internal address includes:
fuse independent address bits produced from address bits which is not said specific address bit in said first internal address, independently of a state of said first fuse unit,
a fuse dependent address bit having a value corresponding to said state of said first fuse unit and a value of said specific address bit, and
wherein said decoder circuit selects a part of said plurality of memory arrays in response to said fuse dependent address bit and selects one of said part of said plurality of memory arrays and a memory cell of said one of the part of said plurality of memory arrays in response to said fuse independent address bits.

6. The semiconductor memory device according to claim 5, further comprising:
a second fuse unit configured to includes fuses and anti-fuses integrated,
wherein said internal address supplying unit produces all address bits of said first internal address in response to corresponding respective address bits of said external address, when said second fuse unit is set to a first state, and said internal address supplying unit produces address bits except for said specific address bit of said first internal address in response to corresponding respective address bits of said external address, and fixes said specific address bit to a predetermined value, when said second fuse unit is set to a second state.

7. The semiconductor memory device according to claim 6, wherein said memory cell is a flash memory.

8. The semiconductor memory device according to claim 6, wherein said fuse dependent address bit has one of a value of said specific address bit and a reversed value of said specific address bit.

* * * * *